United States Patent
Teng

(10) Patent No.: US 7,674,571 B2
(45) Date of Patent: *Mar. 9, 2010

(54) LASER SENSITIVE LITHOGRAPHIC PRINTING PLATE COMPRISING SPECIFIC ACRYLATE MONOMER AND INITIATOR

(76) Inventor: Gary Ganghui Teng, 10 Kendall Dr., Northborough, MA (US) 01532

( * ) Notice: Subject to any disclaimer, the term of this patent is extended or adjusted under 35 U.S.C. 154(b) by 63 days.

This patent is subject to a terminal disclaimer.

(21) Appl. No.: 11/638,932

(22) Filed: Dec. 13, 2006

(65) Prior Publication Data

US 2007/0172766 A1   Jul. 26, 2007

Related U.S. Application Data

(63) Continuation-in-part of application No. 11/595,468, filed on Nov. 9, 2006, now abandoned, and a continuation-in-part of application No. 11/336,132, filed on Jan. 21, 2006, now Pat. No. 7,348,132.

(51) Int. Cl.
  *G03C 5/18* (2006.01)
  *G03F 7/00* (2006.01)
(52) U.S. Cl. .................. 430/302; 430/300; 101/454
(58) Field of Classification Search .......... 430/270.1, 430/300, 302
  See application file for complete search history.

(56) References Cited

U.S. PATENT DOCUMENTS

| | | | | |
|---|---|---|---|---|
| 4,228,232 A * | 10/1980 | Rousseau | ................. | 430/271.1 |
| 4,458,006 A * | 7/1984 | Donges et al. | ........... | 430/283.1 |
| 4,762,772 A * | 8/1988 | Kobayashi et al. | .......... | 430/309 |
| 6,410,208 B1 * | 6/2002 | Teng | .......................... | 430/302 |
| 6,541,183 B2 * | 4/2003 | Teng | .......................... | 430/303 |
| 6,689,537 B2 * | 2/2004 | Urano et al. | ............. | 430/273.1 |
| 6,900,250 B2 * | 5/2005 | Uesugi et al. | ................. | 522/31 |
| 7,041,431 B2 * | 5/2006 | Urano et al. | ................. | 430/302 |
| 7,213,516 B1 * | 5/2007 | Teng | .......................... | 101/451 |
| 7,348,132 B2 * | 3/2008 | Teng | .......................... | 430/302 |
| 2002/0018962 A1 * | 2/2002 | Urano et al. | ............. | 430/273.1 |
| 2003/0186165 A1 | 10/2003 | Gries et al. | ............. | 430/281.1 |
| 2004/0013968 A1 * | 1/2004 | Teng | ....................... | 430/270.1 |
| 2004/0255806 A1 * | 12/2004 | Klein et al. | ................. | 101/477 |
| 2005/0234214 A1 * | 10/2005 | Weipert et al. | .............. | 528/272 |
| 2005/0266349 A1 | 12/2005 | Van Damme et al. | ....... | 430/300 |
| 2006/0024614 A1 | 2/2006 | Williamson | .............. | 430/270.1 |
| 2006/0216646 A1 | 9/2006 | Goto et al. | ................... | 430/302 |

OTHER PUBLICATIONS

Dzunuzovic et al., Dynamincal mechanical analysis of photocrosslinked hyperbranched urethane acrylates,2004, Journal of Serb. Chem. Soc. 69 (6) p. 441-453.*
Dunuzovic et al. ( J. Serb. Chem Soc. 2004).*
Dzunuzovic et al. Dyamincal mechanical analysis of photocrosslinked hyperbranched urethane acrylates, 2004, Journal of Serb. Chem. Soc. 69 (6) p. 441-453.*

* cited by examiner

*Primary Examiner*—Cynthia H Kelly
*Assistant Examiner*—Chanceity N Robinson

(57) ABSTRACT

High speed violet or ultraviolet laser sensitive lithographic printing plate comprising on a substrate a specific photosensitive composition is described. The photosensitive layer comprises a multifunctional (meth)acrylate monomer, a hexaarylbiimidazole compound, and a sensitizing dye. Combination of both multifunctional urethane (meth)acrylate monomer and multifunctional non-urethane (meth)acrylate monomer can be advantageously used. The plate is imagewise exposed with a violet or ultraviolet laser at a dosage of less than 1000 $\mu J/cm^2$, and then developed either off press or on press.

27 Claims, No Drawings

US 7,674,571 B2

LASER SENSITIVE LITHOGRAPHIC PRINTING PLATE COMPRISING SPECIFIC ACRYLATE MONOMER AND INITIATOR

RELATED PATENT APPLICATIONS

This application is a continuation-in-part application of U.S. patent application Ser. No. 11/595,468 filed Nov. 9, 2006 now abandoned and U.S. patent application Ser. No. 11/336,132 filed Jan. 21, 2006 now U.S. Pat. No. 7,348,132.

FIELD OF THE INVENTION

This invention relates to lithographic printing plates. More particularly, it relates to high speed laser sensitive lithographic printing plates having a photosensitive layer comprising a multifunctional (meth)acrylate monomer, a hexaarylbiimidazole compound, and a sensitizing dye.

BACKGROUND OF THE INVENTION

Lithographic printing plates (after process) generally consist of ink-receptive areas (image areas) and ink-repelling areas (non-image areas). During printing operation, an ink is preferentially received in the image areas, not in the non-image areas, and then transferred to the surface of a material upon which the image is to be produced. Commonly the ink is transferred to an intermediate material called printing blanket, which in turn transfers the ink to the surface of the material upon which the image is to be produced.

At the present time, lithographic printing plates (processed) are generally prepared from lithographic printing plate precursors (also commonly called lithographic printing plates) comprising a substrate and a photosensitive coating deposited on the substrate, the substrate and the photosensitive coating having opposite surface properties. The photosensitive coating is usually a photosensitive material, which solubilizes or hardens upon exposure to an actinic radiation. In positive-working systems, the exposed areas become more soluble and can be developed to reveal the underneath substrate. In negative-working systems, the exposed areas become hardened and the non-exposed areas can be developed to reveal the underneath substrate. Conventionally, the actinic radiation is from a lamp (usually an ultraviolet lamp) and the image pattern is generally determined by a photomask that is placed between the light source and the plate.

The exposed plate is usually developed with a liquid developer such as an aqueous alkaline developer to bare the substrate in the non-hardened or solubilized areas. On-press developable lithographic printing plates have been disclosed in the literature. Such plates can be directly mounted on press after exposure to develop with ink and/or fountain solution during the initial prints and then to print out regular printed sheets. No separate development process before mounting on press is needed. Among the patents describing on-press developable lithographic printing plates are U.S. Pat. Nos. 5,258,263, 5,516,620, 5,561,029, 5,616,449, 5,677,110, 5,811,220, 6,014,929, 6,071,675, 6,482,571, 6,737,220, 6,994,028, 6,969,575, and 6,949,327.

Laser sources have been increasingly used to imagewise expose a lithographic printing plate that is sensitized to a corresponding laser. This allows the elimination of the photomask film, reducing material, equipment and labor cost. Among the lasers useful are infrared lasers (about 830 nm or 1064 nm), FD-YAG laser (about 532 nm), violet laser (about 405 nm), and ultraviolet laser (such as about 375 nm). Violet and ultraviolet laser sensitive plates are quite attractive because of their yellow light handling capability (in contrast to red light handling for FD-YAG sensitive plate) and higher quantum efficiency (than infrared laser sensitive plate). However, the energy output of a violet or ultraviolet laser diode is much lower than that of an infrared laser diode. In order to be imaged with a violet or ultraviolet laser imager at a practical speed, a violet or ultraviolet laser sensitive plate should have a sensitivity of less than $1000\,\mu J/cm^2$, preferably less than 300 $\mu J/cm^2$, more preferably less than $200\,\mu J/cm^2$, and most preferably less than $100\,\mu J/cm^2$, which is significantly lower than the sensitivity required for an infrared laser sensitive plate (typically 50 to $300\,\mu J/cm^2$) or a conventional plate exposed with an ultraviolet lamp through a photomask (typically 50 to $300\,\mu J/cm^2$).

Silver halide based violet laser sensitive plate has, recently been introduced as the first lithographic printing plate suitable for imaging with violet laser, utilizing the inherently high sensitivity of silver halide. Examples include U.S. Pat. No. 6,541,176. However silver halide based plates have the disadvantages of relatively low run length and generating hazardous silver waste.

Photopolymerizable composition based (also called photopolymer) violet or ultraviolet laser sensitive plates are very attractive because of the high durability of photopolymer plates. However, because of the extremely high sensitivity requirement of the violet or ultraviolet laser sensitive plate, a commercially viable violet or ultraviolet laser sensitive photopolymer plate can not be achieved by simple addition of a laser absorbing sensitizer into a conventional photopolymer plate but will require certain specific photopolymerizable composition. The selection of the monomer, polymer, and intiator is crucial in achieving a commercially viable violet or ultraviolet laser sensitive photopolymer plate.

Violet or ultraviolet laser sensitive plates having a (meth)acrylate monomer, a hexaarylbiimidazole compound as initiator, and a sensitizing dye have been disclosed in the literature.

U.S. Pat. No. 6,689,537 (Urano et al) describes some specific compositions for violet photopolymer plate, wherein the photosensitive layer comprises multifunctional (with 3 or more functional groups) urethane acrylate monomers, difunctional non-urethane acrylate monomers, a hexaarylbiimidazole compound, and a sensitizing dye.

U.S. Pat. App. Pub. No. 2003/0186165 (Gries et al) describes some specific compositions for violet photopolymer plate, wherein the photosensitive layer comprises difunctional urethane (meth)acrylate monomers, a hexaarylbiimidazole compound, and a sensitizing dye.

U.S. Pat. App. Pub. No. 2006/0024614 (Williamson) describes some specific compositions for violet photopolymer plate, wherein the photosensitive layer comprises a difunctional urethane (meth)acrylate monomer, a hexaarylbiimidazole compound, and a sensitizing dye.

U.S. Pat. App. Pub. No. 2005/0266349 (Van Damme et al) describes some specific compositions for violet photopolymer plate developable with a gum solution, wherein the photosensitive layer comprises difunctional urethane (meth)acrylate monomers, a hexaarylbiimidazole compound, and a sensitizing dye.

U.S. Pat. App. Pub. No. 2006/0216646 (Goto et al) describes some specific compositions for violet photopolymer plate, wherein the photosensitive layer comprises a multifunctional non-urethane (meth)acrylate monomer, a hexaarylbiimidazole compound, and a sensitizing dye.

Among the above patents and applications, no specific photosensitive composition containing a multifunctional urethane (meth)acrylate monomer, a multifunctional non-urethane (meth)acrylate monomer, a hexaarylbiimidazole compound, and a sensitizing dye was disclosed.

The inventor has found, surprisingly, violet or ultraviolet laser sensitive lithographic plates having a multifunctional urethane (meth)acrylate monomer, a multifunctional non-urethane (meth)acrylate monomer, a hexaarylbiimidazole compound, and a sensitizing dye can give excellent photospeed and press durability.

SUMMARY OF THE INVENTION

According to the present invention, there has been provided a lithographic printing plate, suitable for imagewise exposure with a violet or ultraviolet laser having a wavelength of from 250 nm to 430 nm, comprising on a substrate a photosensitive layer comprising a urethane monomer having at least 3 (meth)acrylate groups, a non-urethane monomer having at least 3 (meth)acrylate groups, a hexaarylbiimidazole compound, and a sensitizing dye. A polymeric binder is preferably added in the photosensitive layer. A protective layer (preferably a water soluble or dispersible overcoat) is preferably further coated on the photosensitive layer.

According to a second aspect of the present invention, there has been provided a method of exposing the above plate with a violet or ultraviolet laser having a wavelength of from 250 to 430 nm at a dosage of less than 1000 $\mu J/cm^2$ according to digital imaging information to cause hardening of the photosensitive layer in the exposed areas.

According to a third aspect of the present invention, there has been provided a method of developing the above exposed plate with an aqueous developer.

According to a fourth aspect of the present invention, there has been provided a method of developing the above exposed plate with an aqueous alkaline developer having a pH of at least 9.0.

According to a fifth aspect of the present invention, there has been provided a method of developing the above exposed plate with a non-aqueous alkaline developer having a pH of from 2.0 to 8.5.

According to a sixth aspect of the present invention, there has been provided a method of developing the above exposed plate with ink and/or fountain solution on a lithographic press, wherein the photosensitive layer of the plate is soluble or dispersible in ink and/or fountain solution.

According to a seventh aspect of the present invention, there has been provided a method of developing the above exposed plate with ink and/or fountain solution, or with a hydrophobic paste (including hydrophobic viscous liquid) and/or an aqueous solution (including water), off a lithographic press.

According to an eighth aspect of the present invention, there has been provided a ink and/or fountain solution developable lithographic plate comprising on a substrate a photosensitive layer comprising a multifunctional (meth)acrylate monomer, a hexaarylbiimidazole compound, and a violet or ultraviolet laser sensitizing dye; also provided is a method of exposing said plate with a violet or ultraviolet laser at a dosage of less than 1000 $\mu J/cm^2$ and then developing said exposed plate with ink and/or fountain solution on a lithographic press; further provided is a method of exposing said plate with a violet or ultraviolet laser at a dosage of less than 1000 $\mu J/cm^2$ and then developing said exposed plate with ink and/or fountain solution off a lithographic press.

According to an ninth aspect of the present invention, there has been provided a hydrophobic paste and/or an aqueous solution developable lithographic plate comprising on a substrate a photosensitive layer comprising a multifunctional (meth)acrylate monomer, a hexaarylbiimidazole compound, and a violet or ultraviolet laser sensitizing dye; also provided is a method of exposing said plate with a violet or ultraviolet laser at a dosage of less than 1000 $\mu J/cm^2$ and then developing such plate with a hydrophobic paste and/or an aqueous solution off a lithographic press.

According to a tenth aspect of the present invention, for each of the method provided above, there has been provided a method of applying a deactivating agent to said plate to deactivate the photo hardening capability of the photosensitive layer, after said laser exposure and before said development.

For plate developable with an aqueous alkaline developer, the photosensitive layer preferably comprises an alkaline soluble polymeric binder (preferably with carboxylic acid groups); an alkaline insoluble polymeric binder can also be added in the photosensitive layer, preferably at an amount less than the alkaline soluble polymeric binder. For on-press developable plate, the photosensitive layer can contain an alkaline soluble or an alkaline insoluble polymeric binder or both.

The plate of this invention is exposed with a violet or ultraviolet laser at a dosage of less than 1000 $\mu J/cm^2$, preferably less than 300 $\mu J/cm^2$, more preferably less than 200 $\mu J/cm^2$, and most preferably less than 100 $\mu J/cm^2$. The weight ratio of all the (meth)acrylate monomers to all the polymeric binders is preferably at least 0.5, more preferably at least 1.0, even more preferably at least 1.5, and most preferably at least 2.0. The weight ratio of all the urethane monomers having at least 3 (meth)acrylate groups to all the non-urethane monomers having at least 3 (meth)acrylate groups is preferably from 0.1 to 10, more preferably from 0.3 to 3.

For on-press development with ink and/or fountain solution, the laser exposure can be off-press or on-press. For off-press imaging, the plate is exposed on a separate laser imaging device and then mounted on press for development with ink and/or fountain solution and lithographic printing. For on-press imaging, the plate is preferably exposed with a laser while mounted on the plate cylinder of a lithographic press and then directly developed on the same plate cylinder with ink and/or fountain solution before printing out regular printed sheets.

DETAILED DESCRIPTION OF THE PREFERRED EMBODIMENTS

The substrate employed in the lithographic plates of this invention can be any lithographic support. Such a substrate may be a metal sheet, a polymer film, a coated paper, or a seamless sleeve. Aluminum (including aluminum alloy) sheet is a preferred metal support. Particularly preferred is an aluminum support that has been grained and anodized, optionally further deposited with a barrier layer. Polyester film is a preferred polymeric film support. A surface coating may be coated to achieve desired surface properties. For wet plate, the substrate should have a hydrophilic or oleophilic surface, depending on the surface properties of the photosensitive layer; commonly, a wet lithographic plate has a hydrophilic substrate and an oleophilic photosensitive layer. For waterless plate, the substrate should have an oleophilic or oleophobic surface, depending on the surface properties of the photosensitive layer.

Particularly preferred hydrophilic substrate for a wet lithographic plate is an aluminum support that has been grained and anodized (preferably further treated with hot water); or grained, anodized and deposited with a hydrophilic barrier layer. Surface graining can be achieved by mechanical graining or brushing, chemical etching, and/or AC electrochemical graining. Electrochemical graining or combination of mechanical graining and electrochemical graining is the preferred graining method. The grained aluminum is typically treated with a basic or acidic solution to remove the smut (called desmut treatment), and then subjected to an electrochemical anodization process utilizing an acid such as sulfuric acid and/or phosphoric acid. The anodization process serves to form an anodic oxide layer and is preferably controlled to create a layer of at least $0.1 \text{ g/m}^2$, more preferably 1 to $8 \text{ g/m}^2$, and most preferably 2 to $4 \text{ g/m}^2$. The desmut is preferably controlled to achieve a reflection optical density of preferably from 0.10 to 1.0, more preferably from 0.20 to 0.70, even more preferably from 0.25 to 0.60, and most preferably from 0.30 to 0.50 for the final substrate.

The grained and anodized aluminum can be further treated with hot water (such as at 80° C. for 10 seconds) to improve the surface hydrophilicity or treated with a hydrophilic material to form a hydrophilic barrier layer. Suitable hydrophilic materials include metal silicate such as sodium silicate, phosphate fluoride (formed from a solution containing sodium dihydrogen phosphate and sodium fluoride, called phosphate fluoride solution), phosphoric acid, and hydrophilic polymer such as polyvinyl phosphonic acid, polyacrylamide, polyacrylic acid, polybasic organic acid, copolymers of vinyl phosphonic acid and acrylamide. Polyvinyl phosphonic acid and its copolymers are preferred polymers. The hydrophilic material can be formed on the aluminum surface by thermal or electrochemical method. By thermal method, the grained and anodized aluminum passes through or is immersed for a certain time in a solution containing the hydrophilic material at preferably an elevated temperature, such as at 80° C. for 10 seconds. By electrochemical method, a DC or AC electricity is applied to the aluminum while passing through or immersed in the solution containing the hydrophilic material. Processes for forming a hydrophilic barrier layer on aluminum in lithographic printing plate application are well known in the art, and examples can be found in U.S. Pat. Nos. 2,714,066, 4,153,461, 4,399,021, 5,368,974, and 6,555,205.

The photosensitive layer of the present invention preferably comprises a polymeric binder, a urethane monomer having at least 3 (meth)acrylate groups, a non-urethane monomer having at least 3 (meth)acrylate groups, a hexaarylbiimidazole compound, and a sensitizing dye; and is capable of hardening upon exposure to a violet or violet laser having wavelength of from 250 to 430 nm. A hydrogen donor is preferably added. Various additives, such as surfactant, colorant (dye or pigment), exposure indicating dye (such as leuco crystal violet, leucomalachite green, azobenzene, 4-phenylazodiphenylamine, and methylene blue dyes), and free radical stabilizer (such as methoxyhydroquinone) can be added. Monomers with lower (meth)acrylate functionality can be added. The polymeric binder can be free of ethylenic groups or contain ethylenic groups. Various types of polymeric binders can be used, including polymers from chain polymerization such as methylmethacrylate/methacrylic acid copolymer, and polymers from step polymerization such as polyurethanes; preferred are polymers based on chain polymerization; more preferred are polymers comprising (meth) acrylate units in the main chain. The photosensitive layer preferably has a coverage of from 0.1 to $6.0 \text{ g/m}^2$, more preferably from 0.03 to $3.0 \text{ g/m}^2$, and most preferably from 0.8 to $2.0 \text{ g/m}^2$.

The weight ratio of all the urethane monomers having at least 3 (meth)acrylate groups to all the non-urethane monomers having at least 3 (meth)acrylate groups is preferably from 0.1 to 10, more preferably from 0.3 to 3. The weight ratio of all the monomers having at least 3 (meth)acrylate groups to all the polymeric binders is preferably at least 0.5, more preferably from 1.0 to 6.0, even more preferably from 1.5 to 5.0, and most preferably from 2.0 to 4.0. The urethane monomer preferably has at least 4 (meth)acrylate groups, more preferably at least 5 (meth)acrylate groups, and most preferably at least 6 (meth)acrylate groups. The non-urethane monomer preferably has at least 4 (meth)acrylate groups, more preferably at least 5 (meth)acrylate groups, and most preferably at least 6 (meth)acrylate groups. Preferably, the urethane monomer has at least 4 (meth)acrylate groups and the non-urethane monomer has at least 4 (meth)acrylate groups; more preferably, the urethane monomer has at least 6 (meth)acrylate groups and the non-urethane monomer has at least 4 (meth)acrylate groups.

The hardened areas of the thermosensitive layer should exhibit an affinity or aversion substantially opposite to the affinity or aversion of the substrate to at least one printing liquid selected from the group consisting of ink and an adhesive fluid for ink. An adhesive fluid for ink is a fluid that repels ink. Fountain solution is the most commonly used adhesive fluid for ink. A wet plate consists of oleophilic image areas and hydrophilic background areas and is printed on a wet press equipped with both ink and fountain solution (or equipped with a single-fluid ink). A waterless plate consists of oleophilic image areas and oleophobic background areas and is printed on a waterless press equipped with ink.

In this patent, the term monomer includes both monomer and oligomer, and the term (meth)acrylate includes both acrylate and methacrylate (A monomer means a monomer or an oligomer, and a (meth)acrylate monomer means an acrylate monomer, a methacrylate monomer, or a monomer with both acrylate and methacrylate groups.). The term monomer to polymer weight ratio means the weight ratio of all the specific monomers to all the polymeric binders (which are solid film-forming polymers); liquid polymer such as nonionic surfactant is not considered polymeric binder and is not included in the monomer to polymer weight ratio calculation. The term "comprises a . . . " means "comprises at least one . . . "; for example, the term "comprising a monomer" means "comprising at least one monomer." The term "a solvent" means either a substantially pure solvent (with only one solvent compound, such as acetone, plus any impurities) or a mixture of two or more substantially pure solvents (with two or more solvent compounds, such as a mixture of acetone and ethanol, plus any impurities). The term "yellow-red light" means a yellow light, a red light, or a light with color in between yellow and red such as orange light.

Polymeric binder for the photosensitive layer of this invention can be any solid film-forming polymer. The polymer may or may not have (meth)acrylate groups or other ethylenic groups (such as allyl groups). Examples of suitable polymeric binders include (meth)acrylic polymers and copolymers (such as polybutylmethacrylate, polyethylmethacrylate, polymethylmethacrylate, polymethylacrylate, butylmethacrylate/methylmethacrylate copolymer, methylmethacrylate/methylmethacrylic acid copolymer, polyallylmethacrylate, and allylmethacrylate/methacrylic acid copolymer), polyvinyl acetate, polyvinyl butyrate, polyvinyl chloride, styrene/acrylonitrile copolymer, styrene/maleic anhydride copolymer and its partial ester, nitrocellulose, cellulose acetate butyrate, cellulose acetate propionate, vinyl chloride/vinyl acetate copolymer, butadiene/acrylonitrile copolymer, and polyurethane binder. Examples of suitable polymers having ethylenic groups include polymers containing (meth)acrylate groups or allyl groups. Polymers having acetoacetate groups, including, for example, the acetoacetylated polymers as described in U.S. Pat. Nos. 6,919,416 and 7,001,958, can also be used as the polymeric binder in the photosensitive layer of this invention. Useful polymeric binders include polymers from chain polymerization (including free radical, cationic and anionic polymerization) such as methylmethacrylate/methacrylic acid copolymer, and polymers from step polymerization (including condensation polymerization) such as polyurethanes and polyesters; preferred are polymers based on chain polymerization; more preferred are polymers comprising (meth)acrylate units in the main chain (such as polymethylmethacrylate and methylmethacrylate/acrylic acid/styrene terpolymer). The alkaline soluble polymeric binder suitable for the photosensitive layer of this invention can be any polymeric binder that is soluble in an aqueous alkaline solution having a pH of at least 9.0, preferably from 10.0 to 13.5. Preferred alkaline soluble polymeric binders are polymers with carboxylic acid groups. The acid number is preferably from 20 to 300, more preferably from 40 to 200, and most preferably from 60 to 150 mg KOH/g polymer. The acid number is defined as the amount in mg of KOH required to neutralize 1 g of the polymer. The polymeric binder suitable for the photosensitive layer of this invention has a weight average molecular weight of at least 5,000, preferably from 10,000 to 1,000,000, more preferably from 20,000 to 500,000, and most preferably from 50,000 to 200,000 Dalton. It is noted that polymeric compounds with weight average molecular weight of less that 5,000 can also be added in the photosensitive layer of this invention; however, in order to avoid confusion, such compounds are not considered as polymeric binder and are called oligomer (without or with ethylenic groups) in this application (oligomers having ethylenic groups are also included in the definition of monomers in this application).

Suitable free-radical polymerizable monomers (including oligomers) for the instant invention include, for example, multifunctional (meth)acrylate monomers or oligomers, such as (meth)acrylate esters of ethylene glycol, trimethylolpropane, pentaerythritol, ethoxylated ethylene glycol and ethoxylated trimethylolpropane; multifunctional urethanated (meth)acrylate; multifunctional epoxylated (meth)acrylate; oligomeric amine diacrylates; and reaction products of a compound having at least one acetoacetate group and a multifunctional (meth)acrylate compound. The monomer for the photosensitive layer of this invention preferably has at least 3 (meth)acrylate groups, more preferably at least 4 (meth)acrylate groups, even more preferably at least 5 (meth)acrylate groups, and most preferably at least 6 (meth)acrylate groups. However, monofunctional or difunctional (meth)acrylate monomer can be added into the photosensitive layer having multifunctional (meth)acrylate monomers; the total amount of such monofunctional or difunctional monomers is preferably less than 50% by weight of the total monomers, more preferably less than 30%, and most preferably less than 10%. Acrylate monomer is preferred over methacrylate monomer because of the faster photospeed of acrylate group over methacrylate group. The monomer has a molecular weight of less than 5,000, preferably from 100 to 3,000, more preferably from 200 to 2,000, and most preferably from 300 to 1,500 Dalton.

Urethane (meth)acrylate monomers include any compounds having at least one urethane linkage (—NHCOO—) and at least one (meth)acrylate group. Preferred urethane (metha)acrylate monomers are those with at least 3 (meth) acrylate groups, more preferably at least 4 (meth)acrylate groups, even more preferably at least 5 (meth)acrylate groups, and most preferably at least 6 (meth)acrylate groups. Urethane (meth)acrylate monomer is usually formed by reacting a compound having at least one isocyanate group with a (meth)acrylate compound having a hydroxy group. Urethane monomer with 2 or more (meth)acrylate groups are usually formed from a compound having one or more isocyanate groups and a (meth)acrylate compound having a hydroxy group and one or more (meth)acrylate groups. For example, a tetrafunctional urethane (meth)acrylate monomer can be formed from a compound having one hydroxy group and 2 (meth)acrylate groups with a bifunctional isocyanate compound. Suitable isocyanate compounds include, for example, aromatic diisocyanate such as p-phenylene diisocyanate, 2,4-tolylene diisocyanate, 2,6-tolylene diisocyanate, 4,4'-diphenylmethane diisocyanate, naphthalene-1,5-diisocyanate and tolydine diisocyanate; aliphatic diisocyanate such as hexamethylene diisocyanate, lysinemethyl ester diisocyanate, 2,4,4-trimethylhexamethylene diisocyanate and dimer acid diisocyanate; alicyclic diisocyanate such as isophorone diisocyanate, and 4,4'-methylenebis(cyclohexylisocyanate); aliphatic diisocyanate having an aromatic ring, such as xylylene diisocyanate; triisocyanate such as lysine ester triisocyanate, 1,6,11-undecane triisocyanate, 1,8-diisocyanate-4-isocyanatemethyloctane, 1,3,6-hexamethylene triisocyanate, bicycloheptane triisocyanate, tris(isocyanate phenylmethane) and tris(isocyanatephenyl)thiophosphate; and polyisocyanate formed from condensation of three or more diisocyanate compounds such as 2,4-tolylene diisocyanate isocyanurate trimer, 2,4-tolylene diisocyanate-trimethylolpropane adduct, 1,6-hexanediisocyante isocyanurate trimer. Suitable (meth)acrylate compounds with one hydroxy group include pentaerythritol tri(meth)acrylate, dipentaerythritol penta(meth)acrylate, ditrimethylolpropane tri (meth)acrylate and pentaerythritol di(meth)acrylate monostearate. Various urethane (meth)acrylate monomers are described in U.S. Pat. No. 6,232,038 and U.S. Pat. Pub. No. 2002/0018962, and can be used as the urethane (meth) acrylate monomers of this instant invention. Among the urethane (meth)acrylate monomers, urethane acrylate monomer is preferred. Either aromatic urethane (meth)acrylate monomer (which contains at least one aromatic group in the molecule) or aliphatic urethane (meth)acrylate monomer (which does not contain any aromatic group in the molecule) or both can be used in a photosensitive layer of this invention.

Suitable non-urethane (meth)acrylate monomers can be any (meth)acrylate monomers without urethane linkage (—NHCOO—) in the molecule. Suitable non-urethane (meth)acrylate monomers with 3 or more (meth)acrylate groups include any non-urethane (meth)acrylate monomer with 3 or more (meth)acrylate groups, such as trimethylolpropane triacrylate, pentaerythritol tetra(meth)acrylate, dipentaerythritol penta(meth)acrylate, dipentaerythritol hexa (meth)acrylate, di(trimethylolpropane) tetra(meth)acrylate. Among the non-urethane (meth)acrylate monomers, non-urethane acrylate monomer is preferred.

In this invention, at least one hexaarylbiimidazole compound is used in the photosensitive layer as free radical initiator. The hexaarylbiimidazole compound is a biimidazole compound having three aryl groups on each of the two imidazole moieties. Examples of hexaarylbiimidazole compounds include 2,2'-bis(o-chlorophenyl)-4,4',5,5'-tetraphenylbiimidazole, 2,2'-bis(o-chlorophenyl)-4,4',5,5'-tetra(p-methoxyphenyl)biimidazole, 2,2'-bis(o-chlorophenyl)-4,4', 5,5'-tetra(p-methylphenyl)biimiidazole, 2,2'-bis(o-chlorophenyl)-4,4',5,5'-tetra(p-ethoxycarbonylphenyl) biimidazole, 2,2'-bis(o-chlorophenyl)-4,4',5,5'-tetra(p-fluorophenyl)biimidazole, 2,2'-bis(o-bromophenyl)-4,4',5, 5'-tetra(p-iodophenyl)biimidazole, 2,2'-bis(o-chlorophenyl)-4,4',5,5'-tetra(p-chloronaphthyl)biimidazole, 2,2'-bis(o- chlorophenyl)-4,4',5,5'-tetra(p-chlorophenyl)biimidazole, 2,2'-bis(o-bromophenyl)-4,4',5,5'-tetra(p-chlor-p-methoxyphenyl)biimidazole, 2,2'-bis(o-chlorophenyl)-4,4',5,5'-tetra(o,p-dichlorophenyl)biimidazole, 2,2'-bis(o-chlorophenyl)-4,4',5,5'-tetra(o,p-dibromophenyl)biimidazole, 2,2'-bis(o-bromophenyl)-4,4',5,5'-tetra(o,p-dichlorophenyl) biimidazole, 2,2'-bis(o,p-dichlorophenyl)-4,4',5,5'-tetra(o,p-dichlorophenyl)biimidazole, 2,2',4,4'-tris(2-chlorophenyl)-5-(3,4-dimethoxyphenyl)-4',5'-diphenyl biimidazole, and 2,2', 4,4'-bis(2-chlorophenyl)-5,5'-bis(3,4-dimethoxyphenyl) biimidazole. Of these compounds, preferred is a hexaphenylbiimidazole compound, particularly preferred is one which has the ortho-positions of the benzene rings at the 2,2'-positions on the imidazole rings replaced with halogen, more preferred is one having benzene rings at the 4,4',5,5'-positions on the imidazole rings not replaced, replaced with halogen or replaced with alkoxycarbonyl, and most preferred is a combination of embodiments of the two hexaphenylbiimidazole compounds. A particularly useful hexaarylbiimidazole compound is 2,2'-bis(o-chlorophenyl)-4,4',5,5'-tetraphenyl-biimidazole. The hexaarylbiimidazole compound is added in the photosensitive layer preferably at 0.5 to 40% by weight of the photosensitive layer, more preferably at 2 to 30%, and most preferably at 5 to 20%.

One or more other free-radical initiators may be added together with the hexaarylbiimidazole compound in the photosensitive layer. Other useful free radical initiators include, for example, onium salts such as diaryliodonium hexafluoroantimonate, diaryliodonium hexafluorophosphate, diaryliodonium triflate, (4-(2-hydroxytetradecyloxy)phenyl)phenyliodonium hexafluoroantimonate, (4-octoxyphenyl) phenyliodonium hexafluoroantimonate, bis(4-t-butylphenyl) iodonium hexafluorophosphate, triarylsulfonium hexafluorophosphate, triarylsulfonium p-toluenesulfonate, (3-phenylpropan-2-onyl) triaryl phosphonium hexafluoroantimonate and N-ethoxy(2-methyl)pyridinium hexafluorophosphate, and the onium salts as described in U.S. Pat. Nos. 5,955,238, 6,037,098 and 5,629,354; borate salts such as tetrabutylammonium triphenyl(n-butyl)borate, tetraethylammonium triphenyl(n-butyl)borate, diphenyliodonium tetraphenylborate, and triphenylsulfonium triphenyl(n-butyl) borate, and the borate salts as described in U.S. Pat. Nos. 6,232,038 and 6,218,076; haloalkyl substituted s-triazines such as 2,4-bis(trichloromethyl)-6-(p-methoxy-styryl)-s-triazine, 2,4-bis(trichloromethyl)-6-(4-methoxy-naphth-1-yl)-s-triazine, 2,4-bis(trichloromethyl)-6-piperonyl-s-triazine, and 2,4-bis(trichloromethyl)-6-[(4-ethoxyethylenoxy)-phen-1-yl]-s-triazine, and the s-triazines as described in U.S. Pat. Nos. 5,955,238, 6,037,098, 6,010,824, and 5,629,354; and titanocene compounds such as bis($\eta^9$-2,4-cyclopentadien-1-yl) bis[2,6-difluoro-3-(1H-pyrrol-1-yl)phenyl] titanium.

The sensitizing dyes useful in the photosensitive layer of this invention include any dyes capable of absorbing the violet or ultraviolet laser (from 250 to 430 nm) at a dosage of less than 1000 µJ/cm$^2$ to activate the free radical initiator to cause polymerization of the monomers. Suitable sensitizing dyes include, for example, cyanine dyes (including polymethine dyes); chromanone compounds such as 4-diethylaminobenzilidene chromanone; dialkylaminobenzene compounds such as ethyl 4-dimethylaminobenzoate and dialkylaminobenzene as well as any compound with a dialkylaminobenzene moiety; dialkylaminobenzophenone compounds such as 4,4'-bis(dimethylamino)benzophenone, 4,4'-bis(diethylamino)benzophenone, 2-(p-dimethylaminophenyl)benzooxazol, 2-(p-diethylaminophenyl)benzooxazole, 2-(p-dimethylaminophenyl)benzo[4,5]benzooxazole, 2-(p-dimethylaminophenyl)benzo[6,7]benzooxazole, 2,5-bis(p-diethylaminophenyl)1,3,4-oxazole, 2-(p-dimethylaminophenyl)benzothiazole, 2-(p-diethylaminophenyl)benzothiazole, 2-(p-dimethylaminophenyl)benzimidazole, 2-(p-diethylaminophenyl)benzimidazole, 2,5-bis(p-diethylaminophenyl)-1,3,4-thiadiazole, (p-dimethylaminophenyl)pyridine, (p-diethylaminophenyl) pyridine, 2-(p-dimethylaminophenyl)quinoline, 2-(p-diethylaminophenyl)quinoline, 2-(p-dimethylaminophenyl)pyrimidine or 2-(p-diethylaminophenyl)pyrimidine; unsaturated cyclopentanone compounds such as 2,5-bis{[4-(diethylamino)phenyl]methylene}-(2E,5E)-(9Cl)-cyclpentanone and bis(methylindolenyl)cyclopentanone; coumarin compounds such as 3-benzoyl-7-methoxy coumarin and 7-methoxy coumarin; and thioxanthene compounds such as 2-isopropylthioxanthenone. Dialkylaminobenzene compounds (including bis(dialkylamino)benzophenone compounds) are particularly suitable for ultraviolet laser sensitive plate. Bis (dialkylamino)benzophenone compounds are particularly suitable for violet laser sensitive plate. The sensitizing dyes as described in U.S. Pat. Nos. 5,422,204 and 6,689,537, and U.S. Pat. App. Pub. No. 2003/0186165 can be used for the photosensitive layer of this invention. The violet laser sensitizing dye is added in the photosensitive layer preferably at 0.1 to 20% by weight of the photosensitive layer, more preferably 0.5 to 15%, and most preferably 1 to 10%.

The photosensitive composition of the present invention preferably contains one or more hydrogen donors as a polymerization accelerator. Examples of the hydrogen donors include compounds having a mercapto group (also called mercapto compounds) such as 2-mercaptobenzothiazole, 2-mercaptobenzimidazole, 2-mercaptobenzoxazole and 3-mercapto-1,2,4-triazole; and N-aryl-α-amino acids, their salts and esters such as N-phenylglycine, salts of N-phenylglycine, and alkyl esters of N-phenylglycine such as N-phenylglycine ethyl ester and N-phenylglycine benzyl ester. Preferred hydrogen donors are 2-mercaptobenzothiazole, 2-mercaptobenzimidazole, 2-mercaptobenzoxazole, 3-mercapto-1,2,4-triazole, N-phenylglycine, N-phenylglycine ethyl ester, and N-phenylglycine benzyl ester. Combination of at least one mercapto compound and at least one N-aryl-α-amino acid or its ester or salt can be advantageously used in the photosensitive layer to increase the photospeed. The hydrogen donor is added in the photosensitive layer preferably at 0.01 to 15% by weight of the photosensitive layer, more preferably 0.1 to 10%, and most preferably 0.5 to 5%.

Various surfactants may be added into the photosensitive layer to, for example, improve the coatability or developability. Both polymeric and small molecule surfactants can be used. However, it is preferred that the surfactant has low or no volatility so that it will not evaporate from the photosensitive layer of the plate during storage and handling. Nonionic surfactants are preferred. Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (also called block copolymer of propylene oxide and ethylene oxide); ethoxylated or propoxylated acrylate oligomers; and polyethoxylated alkylphenols and polyethoxylated fatty alcohols. The nonionic surfactant is preferably added at from 0.1 to 10% by weight of the photosensitive layer, and more preferably from 0.5 to 5%.

A colorant (dye or pigment) may be added into the photosensitive layer of this invention. For plate developed off press, such colorant is preferably added. Pigment is preferred over dye. The pigment used in the photosensitive layer of this invention is dispersed in the photosensitive layer as fine particles. The aqueous developable photosensitive layer of this invention is preferably coated from a photosensitive coating fluid containing the pigment dispersed in the fluid. A preferred photosensitive fluid comprises a polymeric binder, a (meth)acrylate monomer having at least 3 (meth)acrylate groups, an initiator, a sensitizing dye, a pigment, and an organic solvent. Preferably, the pigment is dispersed in a solvent with addition of a dispersing agent or polymer, before mixing with the rest of the materials for the photosensitive coating fluid. More preferably, the pigment is dispersed in a solvent with addition of a dispersing agent or polymer to form one or more pigment dispersions, at least all the polymeric binders for the photosensitive coating fluid not used in the pigment dispersion are dissolved in at least a portion of the remaining solvent for the fluid to form one or more solutions, and the pigment dispersion or dispersions are mixed with the solution or solutions and any unused materials for the fluid to form the coating fluid. Even more preferably, all the pigment forms one or more liquid pigment dispersions, all the materials not used in the pigment dispersion forms one or more solutions, and the pigment dispersions and the solutions mix to form the photosensitive coating fluid. Most preferably, all the pigment forms only one liquid pigment dispersion, all the materials not used in the pigment dispersion forms only one solution, and the pigment dispersion and the solution are mixed to form the photosensitive coating fluid. The total weight of the pigment dispersions is less than half of the total weight of the photosensitive coating fluid, more preferably less than 20%, and most preferably less than 10%. It is preferred that the pigment dispersion is added into the solution with stirring.

The liquid pigment dispersion can be prepared by any method. Preferably, it is prepared using a high speed disperser (with disk or blade), a ball mill, or a roll mill (such as three roll mill). More preferably, it is prepared by a high speed disperser or a three roll mill. During the dispersing or milling, the pigment content of the pigment dispersion is preferably at least 2%, more preferably from 4 to 50%, and most preferably from 10 to 40% by weight of the dispersion; and the solvent content of the pigment dispersion is preferably at least 30%, more preferably at least 40%, and most preferably at least 50% by weight of the dispersion.

A preferred alkaline developable lithographic plate of this invention comprises on a substrate a photosensitive layer comprising an alkaline soluble polymeric binder, a urethane monomer having at least 3 (meth)acrylate group, a non-urethane monomer having at least 3 (meth)acrylate groups, a hexaarylbiimidazole compound, and a sensitizing dye. A hydrogen donor is preferably added. A pigment is also preferably added. The weight ratio of all the monomers having at least 3 (meth)acrylate group to all the polymeric binders is preferably at least 0.5, more preferably from 1.0 to 6.0, even more preferably from 1.5 to 5.0, and most preferably from 2.0 to 4.0. A preferred sensitizing dye is a dialkylaminobenzene compound (a compound having at least one dialkylaminobenzene moiety); and a more preferred sensitizing dye is a 4,4'-bis(dialkylamino)benzophenone compound. A preferred hydrogen donor is a mercapto compound, or an N-aryl-α-amino acid or its ester or salt. More preferably, both a mercapto compound and an N-aryl-α-amino acid or its ester or salt are used. An alkaline insoluble polymeric binder can be advantageously added, the weight ratio of the alkaline insoluble polymeric binder to the alkaline soluble polymeric binder being preferably less than 1.0, and more preferably less than 0.5. A water soluble or dispersible overcoat is preferably coated on the photosensitive layer. The plate is exposed with a violet or ultraviolet laser having a wavelength of from 250 to 430 nm at a dosage of less than 1000 $\mu J/cm^2$, preferably less than 300 $\mu J/cm^2$, more preferably less than 200 $\mu J/cm^2$, and most preferably less than 100 $\mu J/cm^2$. The exposed plate is developed with an aqueous alkaline developer having a pH of at least 9.0, preferably from 10.0 to 13.5, and more preferably from 11.0 to 13.0. Mechanical brushing or rubbing is preferably applied to the plate surface to facilitate the development process. The developed plate is preferably rinsed with water (such as with water spray). A plate finisher such as gum Arabic or other hydrophilization solution is preferably applied to the plate surface to protect the plate surface or to enhance the hydrophilicity of the background areas of the plate. The plate is preferably heated to 50 to 200° C. for 1 to 600 seconds, more preferably from 70 to 150° C. for 2 to 200 seconds, after laser exposure and before development. For plate with an overcoat, the overcoat is preferably removed with the developer during development or removed in a pre-wash step with water before development; more preferably the overcoat is rinsed off with water after laser exposure and before development (preferably before preheat if the plate is pre-heated).

A preferred non-alkaline aqueous developable lithographic plate of this invention comprises on a substrate a photosensitive layer comprising a polymeric binder, a urethane monomer having at least 3 (meth)acrylate group, a non-urethane monomer having at least 3 (meth)acrylate groups, a hexaarylbiimidazole compound, and a sensitizing dye. A hydrogen donor is preferably added. A pigment is also preferably added. The weight ratio of all the monomers having at least 3 (meth)acrylate group to all the polymeric binders is preferably at least 0.5, more preferably from 1.0 to 6.0, even more preferably from 1.5 to 5.0, and most preferably from 2.0 to 4.0. A preferred sensitizing dye is a dialkylaminobenzene compound (a compound having at least one dialkylaminobenzene moiety); and a more preferred sensitizing dye is a 4,4'-bis(dialkylamino)benzophenone compound. A preferred hydrogen donor is a mercapto compound or an N-aryl-α-amino acid or it ester or salt. More preferably, both a mercapto compound and an N-aryl-α-amino acid or its ester or salt are used. The polymeric binder can be alkaline insoluble or alkaline soluble; preferably an alkaline insoluble polymeric binder is used; and more preferably both an alkaline soluble polymeric binder and an alkaline insoluble polymeric binder are used. A water soluble or dispersible overcoat is preferably coated on the photosensitive layer. The plate is exposed with a violet or ultraviolet laser having a wavelength of from 250 to 430 nm at a dosage of less than 1000 $\mu J/cm^2$, preferably less than 300 $\mu J/cm^2$, more preferably less than 200 $\mu J/cm^2$, and most preferably less than 100 $\mu J/cm^2$. The exposed plate is developed with an aqueous non-alkaline developer having a pH of from 2.0 to 8.5, preferably from 3.0 to 8.0, and more preferably from 4.0 to 7.0. Mechanical brushing or rubbing is preferably applied to the plate surface to facilitate the development process while the plate is in contact with the developer. The plate is preferably heated to 50 to 200° C. for 1 to 600 seconds, more preferably from 70 to 150° C. for 2 to 200 seconds, after the laser exposure and before the development. For plate with an overcoat, the overcoat is preferably removed with the developer during development or removed in a pre-wash step with water before development; more preferably the overcoat is rinsed off with water after laser exposure and before development (preferably before preheat if the plate is pre-heated).

A preferred on-press developable lithographic plate of this invention comprises on a substrate a photosensitive layer comprising a polymeric binder, a monomer having at least 3 (meth)acrylate groups, a hexaarylbiimidazole compound, and a sensitizing dye; more preferably, the photosensitive layer comprises a polymeric binder, a urethane monomer having at least 3 (meth)acrylate group, a non-urethane monomer having at least 3 (meth)acrylate groups, a hexaarylbiimidazole compound, and a sensitizing dye. A hydrogen donor is preferably added. A nonionic surfactant is also preferably added. The photosensitive layer is soluble or dispersible in ink and/or fountain solution. The weight ratio of all the monomers having at least 3 (meth)acrylate group to all the polymeric binders is preferably at least 0.5, more preferably from 1.0 to 6.0, even more preferably from 1.5 to 5.0, and most preferably from 2.0 to 4.0. A preferred sensitizing dye is a dialkylaminobenzene compound; and a more preferred sensitizing dye is a 4,4'-bis(dialkylamino)benzophenone compound. A preferred hydrogen donor is a mercapto compound or an N-aryl-α-amino acid or its ester or salt. More preferably, both a mercapto compound and an N-aryl-α-amino acid or its ester or salt are used. The polymeric binder can be alkaline insoluble or alkaline soluble; preferably an alkaline insoluble polymeric binder is used; and more preferably both an alkaline soluble polymeric binder and an alkaline insoluble polymeric binder are used. An ink and/or fountain solution soluble or dispersible overcoat is preferably coated on the photosensitive layer; more preferably a water soluble or dispersible overcoat is coated on the photosensitive layer. The plate is exposed with a violet or ultraviolet laser having a wavelength of from 250 to 430 nm at a dosage of less than 1000 μJ/cm$^2$, preferably less than 300 μJ/cm$^2$, more preferably less than 200 μJ/cm$^2$, and most preferably less than 100 μJ/cm$^2$. The exposed plate is developed on a lithographic press with ink and/or fountain solution. The exposed plate can be on-press developed under a yellow or red light or in darkness or substantial darkness, followed by lithographic printing preferably under white light. Alternatively, the exposed plate can be applied with a deactivating agent to deactivate the photo hardening capability of the photosensitive layer before on-press development under white light (including any white office light and sunlight). The plate may be heated to 50 to 200° C. for 1 to 600 seconds, more preferably from 70 to 150° C. for 2 to 200 seconds, after said laser exposure and before on-press development or before applied with a deactivating agent.

A preferred lithographic plate suitable for development off press with ink and/or fountain solution, or with a hydrophobic paste (including viscous liquid) and/or an aqueous solution (including water), of this invention comprises on a substrate a photosensitive layer comprising a polymeric binder, a monomer having at least 3 (meth)acrylate groups, a hexaarylbiimidazole compound, and a sensitizing dye; more preferably, the photosensitive layer comprises a polymeric binder, a urethane monomer having at least 3 (meth)acrylate group, a non-urethane monomer having at least 3 (meth)acrylate groups, a hexaarylbiimidazole compound, and a sensitizing dye. A hydrogen donor is preferably added. A nonionic surfactant is also preferably added. The photosensitive layer is soluble or dispersible with ink and/or fountain solution, or with a hydrophobic paste (including viscous liquid) and/o an aqueous solution (including water). The weight ratio of all the monomers having at least 3 (meth)acrylate group to all the polymeric binders is preferably at least 0.5, more preferably from 1.0 to 6.0, even more preferably from 1.5 to 5.0, and most preferably from 2.0 to 4.0. A preferred sensitizing dye is a dialkylaminobenzene compound; and a more preferred sensitizing dye is a 4,4'-bis(dialkylamino)benzophenone compound. A preferred hydrogen donor is a mercapto compound or an N-aryl-α-amino acid or its ester or salt. More preferably, both a mercapto compound and an N-aryl-α-amino acid or its ester or salt are used. The polymeric binder can be alkaline insoluble or alkaline soluble; preferably an alkaline insoluble polymeric binder is used; and more preferably both an alkaline soluble polymeric binder and an alkaline insoluble polymeric binder are used. An ink and/or fountain solution soluble or dispersible overcoat is preferably coated on the photosensitive layer; more preferably a water soluble or dispersible overcoat is coated on the photosensitive layer. The plate is exposed with a violet or ultraviolet laser having a wavelength of from 250 to 430 nm at a dosage of less than 1000 μJ/cm$^2$, preferably less than 300 μJ/cm$^2$, more preferably less than 200 μJ/cm$^2$, and most preferably less than 100 μJ/cm$^2$. The exposed plate is developed off lithographic press with ink and/or fountain solution, or with a hydrophobic paste (including hydrophobic viscous liquid) and/or an aqueous solution (including water); preferably with ink, both ink and fountain solution, a hydrophobic paste, or both a hydrophobic paste and an aqueous solution; and more preferably with ink and fountain solution, or with a hydrophobic paste and an aqueous solution. The plate may be heated to 50 to 200° C. for 1 to 600 seconds, more preferably from 70 to 150° C. for 2 to 200 seconds, after laser exposure and before off-press development.

For plates with rough and/or porous surface, a thin water-soluble interlayer may be deposited between the substrate and the photosensitive layer. Preferably, the substrate surface is rough and/or porous enough and the interlayer is thin enough to allow bonding between the photosensitive layer and the substrate through mechanical interlocking. Such a plate configuration is described in U.S. Pat. No. 6,014,929, the entire disclosure of which is hereby incorporated by reference. Preferred releasable interlayer comprises a water-soluble polymer. Polyvinyl alcohol (including various water-soluble derivatives of polyvinyl alcohol) is the preferred water-soluble polymer. Usually pure water-soluble polymer is coated. However, one or more surfactant and other additives may be added. The water-soluble polymer is generally coated from an aqueous solution with water as the only solvent. A water-soluble organic solvent, preferably an alcohol such as ethanol or isopropanol, can be added into the water-soluble polymer aqueous coating solution to improve the coatability. The alcohol is preferably added at less than 40% by weight of the solution, more preferably at less than 20%, and most preferably at less than 10%. The releasable interlayer preferably has an average coverage of 1 to 200 mg/m$^2$, more preferably 2 to 100 mg/m$^2$, and most preferably 4 to 40 mg/m$^2$. The substrate preferably has an average surface roughness Ra of 0.2 to 2.0 microns, and more preferably 0.4 to 1.0 microns.

The lithographic plate of this invention preferably comprises an overcoat (also called protective layer) on the photosensitive layer, to, for example, enhance the photospeed (by reducing oxygen inhibition), enhance handling capability, and/or improve shelflife stability. The overcoat can be any film-forming material that is developable with a regular liquid developer (such as an aqueous developer) or a developing fluid (such as ink and/or fountain solution, for on-press developable plate) or is removable with water or other solution. The overcoat is preferably removable with water, an organic solvent, or with ink and/or fountain solution; more preferably with water or with ink and/or fountain solution. For aqueous developable plate, the developer is preferably water soluble or dispersible. For on-press ink and/or fountain solution developable plate, as well as for plate developable off press with ink and/or fountain solution or with a hydrophobic paste and/or an aqueous solution, the plate is preferably soluble or dispersible in ink and/or fountain solution; more preferably soluble or dispersible in water. For plate developable with a regular liquid developer, the overcoat preferably has a coverage of from 0.1 to 5.0 g/m$^2$, more preferably from 0.5 to 3.0 g/m$^2$, and most preferably from 1.0 to 2.0 g/m$^2$. For plate developable on press with ink and/or fountain solution, or developable off press with ink and/or fountain solution or with a hydrophobic paste and/or aqueous solution, the overcoat preferably has a coverage of from 0.001 to 3.0 g/m$^2$, more preferably from 0.01 to 1.0 g/m$^2$, and most preferably from 0.05 to 0.5 g/m$^2$.

The water soluble or dispersible overcoat preferably comprises a water-soluble polymer, such as polyvinyl alcohol (including various water-soluble derivatives of polyvinyl alcohol). Combination of two or more water-soluble polymers (such as a combination of polyvinyl alcohol and polyvinylpyrrolidone) may also be used. Polyvinyl alcohol is a preferred water-soluble polymer. Various additives, such as surfactant, wetting agent, defoamer, leveling agent and dispersing agent, can be added into the overcoat formulation to facilitate, for example, the coating or development process. Examples of surfactants useful in the overcoat of this invention include polyethylene glycol, polypropylene glycol, and copolymer of ethylene glycol and propylene glycol, polysiloxane surfactants, perfluorocarbon surfactants, alkylphenyl ethylene oxide condensate, sodium dioctylsulfosuccinate, sodium dodecylbenzenesulfonate, and ammonium laurylsulfate. Various organic or inorganic emulsion or dispersion may be added into the overcoat to, for example, reduce the tackiness or moisture sensitivity of the plate.

The plate is usually supplied as sheets, preferably in a pre-cut size suitable for mounting on the press to be printed with. The plates in sheets are preferably packaged in a light-tight wrapping paper or bag within a box for shipping and storage. The plate taken out of the light-tight package is preferably mounted onto the exposure device (or press, for on-press exposure) within 30 minutes, more preferably within 5 minutes, and most preferably within 2 minutes, in order to avoid prolonged exposure to the room light which is preferably a yellow-red room light. Such plates can also be packaged in a cassette, preferably a light-tight cassette, so that the plate can be automatically loaded onto the plate cylinder of the press. Optionally, an interleaf can be placed between plates in the package to, for example, prevent plates from sticking to each other or from damaging to the coating. For interleaved plates stacked in a loading device or cassette for automatic loading, the interleaf on top of the stack is preferably automatically removed before automatically transferring the plate from top of the stack to said exposure device. The interleaf useful in this invention can be any flexible sheet material, such as regular paper, treated paper (for anti-sticking), wax treated paper, silicone treated paper, or plastic foil. The interleaf is preferably a paper, more preferably a treated paper, and most preferably wax or silicone treated paper.

For plate developable with a regular liquid developer, any liquid developer is suitable which can effectively remove the non-exposed areas of the photosensitive layer. Preferred are aqueous developers, which include alkaline aqueous developers and non-alkaline aqueous developers.

The non-alkaline aqueous developer (as defined in this application) comprises 60-99% by weight of water and has a pH of from 2.0 to 8.5, preferably 3.0 to 8.0, and more preferably 4.0 to 7.0. A surfactant is preferably added. An alcohol solvent is also preferably added. The alcohol solvent is defined as a water-soluble liquid organic compound having at least one hydroxyl group. The alcohol solvent must be soluble in water at the added concentration. Liquid alkyl alcohol (including arylalky alcohol) and its liquid derivatives are preferred alcohol solvents. Alcohol solvents useful for the developer of this invention include, for example, various liquid water-soluble alkyl alcohol, arylalkyl alcohol, alkoxyalkyl alcohol, arylalkoxyalkyl alcohol, aroxyalkyl alcohol, oxydialkanol, and alkyl lactate. Other functional group, such as ester, ether, epoxy, or ethylenic group, may be attached to the alkyl or aryl group. Examples of useful alcohol solvents are benzyl alcohol, phenethyl alcohol, isopropyl alcohol, 1-propyl alcohol, ethyl alcohol, butyl alcohol, ethyl lactate, propyl lactate, butyl lactate, methoxyethanol, ethoxyethanol, propoxyethanol, butoxyethanol, methoxypropanol, ethoxypropanol, propoxypropanol, butoxypropanol, diethylene glycol (2,2'-oxydiethanol), phenoxyethanol, and phenoxypropanol. For the alcohols with isomers, all liquid isomers can be used. Benzyl alcohol is a particularly useful alcohol solvent. Usually one alcohol solvent is used in the developer. However, two or more alcohol solvents can also be used in the same developer. The alcohol solvent is added preferably at 0.1 to 40% by weight of the developer, more preferably at 1 to 20% by weight of the developer, and most preferably at 2 to 10%. The surfactant useful for the non-alkaline developer of this invention can be ionic surfactant, nonionic surfactant or both. Examples of useful surfactants include polyethylene glycol, polypropylene glycol, and copolymer of ethylene glycol and propylene glycol, polysiloxane surfactants, ionic perfluorocarbon surfactants, nonionic perfluorocarbon surfactants, sodium dioctylsulfosuccinate, sodium dodecylbenzenesulfonate, sodium butylnaphthalenesulfate, sodium alkylnaphthalenesulfate, sodium cumenesulfonate, and ammonium laurylsulfate. The surfactant is preferably added at from 0.1 to 20% by weight of the developer, more preferably from 0.5 to 10%, and most preferably from 1 to 5%. Various other additives, such as defoamer, bactericide, dye or pigment, and substrate conditioner (such as gum arabic, and maltodextrin), can be added. Certain acid, such phosphoric acid or citric acid can be added to improve the hydrophilicity of the substrate. Certain salts, such as sodium chloride, monosodium phosphate, trisodium phosphate; potassium phosphate and ammonium sulfite, may be added to, for example, improve the hydrophilicity of the bared substrate.

The aqueous alkaline developer is an aqueous solution comprising 60-99% by weight of water, and 0.02 to 30%, preferably 0.1 to 20% and more preferably 0.5 to 10%, by weight of alkaline compound and having a pH of at least 9.0, preferably from 10.0 to 13.5, and more preferably from 11.0 to 13.0. More than one alkaline compound can be used. Suitable alkaline compounds include inorganic alkaline compounds such as potassium silicate, sodium silicate, potassium hydroxide, and sodium hydroxide, and organic amine compounds such as triethylamine, diethylamine, triethanolamine, and diethanolamine. One or more surfactants (ionic or nonionic or both) are preferably added. Examples of useful surfactants include polyethylene glycol, polypropylene glycol, and copolymer of ethylene glycol and propylene glycol, polysiloxane surfactants, ionic perfluorocarbon surfactants, nonionic perfluorocarbon surfactants, sodium dioctylsulfosuccinate, sodium dodecylbenzenesulfonate, sodium butylnaphthalenesulfate, sodium alkylnaphthalenesulfate, sodium cumenesulfonate, and ammonium laurylsulfate. The surfactant is preferably added at from 0.01 to 20% by weight of the developer, more preferably from 0.1 to 10%, and most preferably from 1 to 5%. Various other additives, such as defoamer, bactericide, dye or pigment, and substrate conditioner (such as gum arabic, and maltodextrin), can be added. Certain salts, such as sodium chloride, potassium phosphate and ammonium sulfite, may be added to, for example, improve the hydrophilicity of the bared substrate. One or more organic solvents, preferably water soluble organic solvents, can be added at 0.1 to 20% by weight of the developer. Preferably, no organic solvent is added.

For alkaline developable plate developed with a developing processor, the alkaline aqueous developer is preferably maintained to have the same developing strength and characteristics (for achieving the same result of the developed plate) by replenishing with the same developer or with a developer replenisher having higher pH. Preferably, the developer is replenished with a replenisher having higher pH. The replenisher preferably has a pH of at least 0.2 higher than the developer, more preferably at least 0.4 higher, and most preferably at least 0.6 higher. In addition to replacing the lost developer (in terms of volume) due to evaporation and development, it is preferred that a portion of the developer is replaced with the replenisher after certain amount of plate throughput and/or time in order to maintain the same developing strength. The developing processor can be replenished automatically or by hand, and preferably automatically. The developing processor can be programmed so that the replenisher is automatically added at certain times in a certain amount corresponding to the square footage of the plate developed, the usage time, and/or idle time of the processor; and the extra amount of the developer in the developer tank is drained off (for example, to a waster container) by overflow. Alternatively, the developing processor can be programmed so that the developer is automatically drained off at a certain amount corresponding to the square footage of plate developed, the usage time, and/or idle time of the processor; and the replenisher is automatically added to replenish the developer by filling up the developer tank on the processor, including the developer lost during development and due to evaporation. Preferably, metered amount of the replenisher is pumped into the developing tank to replace about the same amount of the developer that drains off by overflow, periodically and according to the plate throughput. The replenishing rate is preferably 10-300 ml/m² plate throughput and 2-300 ml/h for off hours and idle time, more preferably 20-200 ml/m² plate throughput and 10-150 ml/h for off hours and idle time, and most preferably 30-100 ml/m² plate throughput and 20-80 ml/h for off hours and idle time.

The developer replenisher for alkaline developable plate of this invention comprises an organic or inorganic alkaline compound, preferably an inorganic alkaline compound, more preferably an alkaline metal hydroxide compound, and most preferably sodium hydroxide or potassium hydroxide. The replenisher preferably further comprises a surfactant, more preferably a nonionic surfactant. Other additives, such as defoamer, dye or pigment, stabilizer, hydrophilization agent (such as gum Arabic), salt, stabilizer, and water-soluble organic solvent can be added. Preferably, no organic solvent is added.

In a particularly useful developer-replenisher system for alkaline developable plate of this invention, the developer comprises a first inorganic alkaline compound and the replenisher comprises a second inorganic alkaline compound, the first and the second inorganic alkaline compounds being the same or different; preferably, the developer comprises a first alkaline metal hydroxide compound and/or metal silicate compound and the replenisher comprises a second alkaline metal hydroxide compound and/or metal silicate compound, the first and the second alkaline metal hydroxide or metal silicate compounds being the same or different; more preferably, the developer comprises an alkaline metal hydroxide (preferably sodium hydroxide or potassium hydroxide) or metal silicate (preferably sodium silicate or potassium silicate), and the replenisher comprises sodium hydroxide or potassium hydroxide. In a preferred specific developer-replenisher system, the developer comprises a sodium silicate or potassium silicate, and the replenisher comprises a sodium hydroxide or potassium hydroxide. In a second preferred specific developer-replenisher system, both the developer and the replenisher comprises sodium silicate or potassium silicate. In a third preferred specific developer-replenisher system, both the developer and the replenisher comprise sodium hydroxide or potassium hydroxide. In a Fourth preferred specific developer-replenisher system, both the developer and the replenisher comprise sodium hydroxide or potassium hydroxide, and both contain no more than 2.0% by weight of metal silicate, preferably no more than 1%, and more preferably no more than 0.5%, and most preferably no metal silicate. For developer comprising sodium hydroxide and/or potassium hydroxide, the concentration of the sodium hydroxide and potassium hydroxide is preferably from 0.02 to 2.0% by weight of the developer, more preferably from 0.04 to 1.0%, and most preferably from 0.1 to 0.5%. For replenisher comprising sodium hydroxide and/or potassium hydroxide, the concentration of the sodium hydroxide and potassium hydroxide is preferably at least 0.04% by weight of the replenisher, more preferably from 0.1 to 2.0%, and most preferably from 0.2 to 1.0%. It is noted that the concentration here is the total concentration of both sodium hydroxide and potassium hydroxide if both are present.

In a further particularly useful developer-replenisher system for alkaline developable plate of this invention, the developer comprises 0.02 to 10% by weight of a first inorganic alkaline compound, 0.1 to 15% by weight of a first surfactant, and 70 to 99% by weight of water; and said replenisher comprises 0.04 to 20% by weight of a second inorganic alkaline compound, 0.1 to 15% by weight of a second surfactant, and 70 to 99% by weight of water; the first and the second inorganic alkaline compounds are the same or different, and the first and the second surfactants are the same or different. The replenisher has a pH of at least 0.2 higher than the developer, preferably at least 0.4 higher, and more preferably at least 0.6 higher. In a first specific system, said first inorganic alkaline compound is sodium silicate or potassium silicate with a concentration of 0.5 to 10% by weight of the developer, and said second inorganic alkaline compound is sodium silicate or potassium silicate with a concentration of 1 to 20% by weight of said replenisher. In a second specific system, said first inorganic alkaline compound is sodium silicate or potassium silicate and has a concentration of 0.5 to 10% by weight of the developer, and said second inorganic alkaline compound is sodium hydroxide or potassium hydroxide with a concentration of 0.1 to 10% by weight of said replenisher. In a third specific system, said first inorganic alkaline compound is sodium hydroxide or potassium hydroxide with a concentration of 0.04 to 1% by weight of the developer, said second inorganic alkaline compound is sodium hydroxide or potassium hydroxide with a concentration of 0.1 to 10% by weight of said replenisher. Here the concentration includes both sodium silicate and potassium silicate, or both sodium hydroxide and potassium hydroxide, if both presents.

The developer in the developer tank of a developing processor is preferably maintained at a substantially constant temperature. A heater and/or chiller, preferably both a heater and a chiller, is preferably installed to maintain such a developer temperature. The temperature setting depends on the particular plate, developer, and processing condition. Preferably, the temperature is set around or slightly above room temperature, more preferably between 15° C. and 40° C., and most preferably between 20° C. and 30° C. The term substantially constant temperature means the temperature is maintained within 4° C. (±4° C.) of the set temperature, preferably within 2° C. (±2° C.), and more preferably within 1° C. (±1° C.) during plate processing.

The plate exposed off press can be rinsed with water to remove the overcoat without developing the photosensitive layer before development. Such a process is called pre-wash. For plate developed off press, after development, the plate can be applied with a plate finisher, such as gum arabic, to improve the hydrophilicity of the substrate in the background areas.

The laser exposed plate can be directly developed. Optionally, the laser exposed plate is overall heated to an elevated temperature to further harden the exposed areas before development. The preheat condition is preferably 50 to 200° C. for 1 to 600 seconds, more preferably 70 to 140° C. for 1 to 300 seconds, and most preferably 90 to 120° C. for 1 to 60 seconds. The plate can be heated by any method that does not cause hardening of the photosensitive layer in the non-exposed areas. Such a heating process is called preheat. Suitable heating methods include, for example, hot air, contacting with a heated material such as a metal board, or applying an infrared radiation. It is noted that the plate temperature usually changes dramatically during the heating process (such as in the heating oven or passing through a heating unit). For development process including a step of washing off the overcoat with water before development, it is preferred that the preheat is performed before washing off the overcoat.

For off-press development, the development as well as the preheat and pre-wash can be carried out by hand or on a development processor. Preferably, the development is carried out on a developing processor. More preferably, all the process steps after laser exposure and before printing on press are carried out on a developing processor. The developing processor can perform the functions of preheat, pre-wash, development with an liquid developer, rinse with water, gumming with a plate finisher, and drying. One or more of the steps, such as preheat or gumming, may be eliminated for certain plate of this invention (depending on, for example, the specific photosensitive layer or substrate).

Violet or ultraviolet lasers useful for the imagewise exposure of the lithographic printing plates of this invention include any laser having a wavelength of from 250 to 430 nm. Examples of such lasers include violet laser diode of about 405 nm, ultraviolet laser diode of about 375 nm, and ultraviolet LEDs. Violet laser diode is especially useful because of its small size and relatively lower cost. The exposure dosage is less than 1000 µJ/cm$^2$, preferably less than 300 µJ/cm$^2$, more preferably from 1 to 200 µJ/cm$^2$, and most preferably from 5 to 100 µJ/cm$^2$, depending on the sensitivity of the photosensitive layer.

Any violet or ultraviolet laser imaging device can be used which provides imagewise laser exposure of 250 to 430 nm according to digital imaging information. Commonly used imaging devices include flatbed imager, internal drum imager, and external drum imager, all of which can be used for the imagewise laser exposure in this invention.

The laser exposure and development are preferably performed under a yellow-red light, preferably a safe light with no substantial radiation below a certain cutoff wavelength (such as an orange light with a cutoff wavelength of 550 nm or a yellow light with a cutoff wavelength of 450 nm), or in substantial darkness such as in a light-tight box. Here, the term yellow-red light means a yellow light, a red light, or a light with color between yellow and red such as orange light. The term "substantial" means at least 99% reaching the ideal or normal condition; for example, "substantial darkness" means the light intensity is less than 1% of the light intensity with a 40-watt regular white fluorescence lamp at 1 meter, and "no substantial radiation below 450 nm" means the light intensity below 450 nm is less than 1% of the light intensity below 450 nm for a 40-watt regular white fluorescence lamp at 1 meter. The developed plate can be handled under any light, including white light. For plate developed on press, the press is preferably under a yellow-red room light or in substantial darkness for at least a portion (by time) of said on-press development, and is preferably under white light for at least a portion (by time) of said lithographic printing; more preferably, said press is under a yellow-red room light (which contains primarily light with wavelengths of above 450 nm and is substantially free of light with wavelengths of below 450 nm) for said on-press development, and is under white light (with a white light source on, and with or without a yellow-red light source also being turned on) for said lithographic printing.

The laser exposed plate can be treated with a deactivating agent to deactivate the photo hardening capability of the photosensitive layer so that the plate can be handled under white light for as long as needed before and during development, as described in U.S. patent application Ser. Nos. 11/266,817 and 11/356,911, the entire disclosure of which is hereby incorporated by reference.

The deactivating agent can be any material that can deactivate the photo hardening capability of the photosensitive layer. It can be a solid or liquid organic or inorganic compound, such as organic or inorganic acid, base, oxidizer, or reducer. The deactivating agent can be applied from a solution (based on water or organic solvent) to the photosensitive layer (with or without overcoat). Preferably, the deactivating agent is soluble in water and is applied from an aqueous solution. A water-soluble organic solvent, such as ethylene glycol, can be added into the aqueous solution. Certain additives, such as dye, dispersed pigment, bactericide, stabilizer, reducer, thickening agent, and surfactant, can be added. For free radical polymerizable photosensitive layer, the deactivating agent can be a compound that can react with a component of the free radical initiating system (such as initiator, sensitizing dye, or hydrogen donor).

The solution containing the deactivating agent can be applied to the photosensitive layer of the plate through any means, such as spray, dipping, roller coating, slot coating, etc. For plate with an overcoat, the deactivating solution can be applied with or without the overcoat being removed first. When the overcoat is not removed before applying the deactivating solution, the deactivating solution may penetrate through the overcoat without removing the overcoat, or partially or completely remove the overcoat.

For photosensitive layer having an amine group in the initiator, sensitizing dye, or hydrogen donor, an acid compound (including organic acid and inorganic acid) can be used as the deactivating agent. Suitable organic acids include, for example, organic compounds having at lease one carboxylic acid group, a sulfonic acid group, or phosphonic acid group. Suitable inorganic acids include, for example, phosphoric acid, boric acid, and hydrochloride acid. Preferred acids are those with moderate acidity, such as carboxylic acid-functional organic compounds, phosphoric acid, and boric acid. Water-soluble organic compounds having at least one carboxylic acid group are preferred organic acids. Suitable organic acids include, for example, citric acid, acetic acid, salicylic acid, glycolic acid, malic acid, and lactic acid. Citric acid and malic acid are particularly suitable because they are widely used natural organic acids and are non-hazardous to the environment. The acid is preferably applied as aqueous solution to deactivate the photosensitive layer. When strong acid (such as hydrochloride acid) is used as deactivating agent, it is preferably diluted to low concentration (such as less than 0.5%, preferably less than 0.1% by weight) in an aqueous solution to apply to the plate so that it does not damage the plate or cause safety problem.

Alkaline compound can also be used as the deactivating agent for certain free radical polymerizable photosensitive layer because it can react with certain free radical initiating system (initiator, sensitizing dye, or hydrogen donor). For example, an alkaline compound can react with a hydrogen donor having carboxylic acid or thiol group. Suitable alkaline compounds include, for example, sodium silicate, potassium silicate, sodium carbonate, sodium hydroxide, and organic amines. Preferred alkaline compounds are water-soluble compounds with moderate basicity, such as sodium silicate, potassium silicate, ammonium hydroxide, and amines. Suitable water-soluble amines include regular amine compounds such as triethylamine, triethanolamine, 2-amino-2-methyl-1-propanol, tris(hydroxymethyl)aminomethane and N-methyl-2-pyrrolidone, and polymeric amines such as polyethyleneamine. The alkaline compound is preferably applied as an aqueous solution to deactivate the photosensitive layer. When strong base (such as sodium hydroxide) is used as deactivating agent, it is preferably diluted to low concentration (such as less than 0.5%, preferably less than 0.1% by weight) in an aqueous solution so that it does not damage the plate or cause safety problem.

The on-press developable plate is usually exposed on an exposure device, and then mounted on press to develop with ink and/or fountain solution and then print out regular printed sheets. However, the plate can also be exposed on a printing press (such as by mounting on the plate cylinder or sliding through a flatbed imager mounted on the press, preferably by mounting on the plate cylinder), and the exposed plate can be directly developed on press with ink and/or fountain solution and then print out regular printed sheets. The ink and/or fountain solution-solubilized or dispersed photosensitive layer and/or overcoat can be mixed into the ink and/or the fountain solution on the rollers, and/or can be transferred to the blanket and then the receiving medium (such as paper). The fountain solution roller is engaged (to the plate cylinder as for conventional inking system or to the ink roller as for integrated inking system) for preferably 0 to 100 rotations, more preferably 1 to 50 rotations and most preferably 5 to 20 rotations (of the plate cylinder), and the ink roller is then engaged to the plate cylinder for preferably 0 to 100 rotations, more preferably 1 to 50 rotations and most preferably 5 to 20 rotations before engaging the plate cylinder and feeding the receiving medium (such as paper). Good quality prints should be obtained preferably under 40 initial impressions, more preferably under 20 impressions, and most preferably under 5 impressions. The plate may be rinsed or applied with an aqueous solution, including water and fountain solution, to remove the water soluble or dispersible overcoat and/or to dampen without developing the plate, after imagewise laser exposure and before on-press development with ink and/or fountain solution.

The ink and fountain solution may be applied at any combination or sequence, as needed for the plate; there is no particular limitation. For conventional wet press, usually fountain solution is applied (to contact the plate) first, followed by contacting with ink roller; preferably, fountain solution is applied to the plate first to dampen without removing the photosensitive layer, followed by contacting with ink to remove the non-hardened areas of the photosensitive layer. For press with integrated inking/dampening system, the ink and fountain solution are emulsified by various press rollers before being transferred to the plate as emulsion of ink and fountain solution.

The ink used in this application can be any ink suitable for lithographic printing. Most commonly used lithographic inks include "oil based ink" which crosslinks upon exposure to the oxygen in the air and "rubber based ink" which does not crosslink upon exposure to the air. Specialty inks include, for example, radiation-curable ink and thermally curable ink. An ink is an oleophilic, liquid or viscous material which generally comprises a pigment dispersed in a vehicle, such as vegetable oils, animal oils, mineral oils, and synthetic resins. Various additives, such as plasticizer, surfactant, drier, drying retarder, crosslinker, and solvent may be added to achieve certain desired performance. The compositions of typical lithographic inks are described in "The Manual of Lithography" by Vicary, Charles Scribner's Sons, New York, and Chapter 8 of "The Radiation Curing: Science and Technology" by Pappas, Plenum Press, New York, 1992.

The fountain solution used in this application can be any fountain solution used in lithographic printing. Fountain solution is used in the wet lithographic printing press to dampen the hydrophilic areas (non-image areas), repelling ink (which is hydrophobic and oleophilic) from these areas. Fountain solution contains mainly water, generally with addition of certain additives such as gum arabic and surfactant. Small amount of alcohol such as isopropanol can also be added in the fountain solution. Water is the simplest type of fountain solution. Fountain solution is usually neutral to mildly acidic. However, for certain plates, mildly basic fountain solution is used. The type of fountain solution used depends on the type of the plate substrate as well as the photosensitive layer. Various fountain solution compositions are described in U.S. Pat. Nos. 4,030,417 and 4,764,213.

Emulsion of ink and fountain solution is an emulsion formed from ink and fountain solution during wet lithographic printing process. Because fountain solution (containing primarily water) and ink are not miscible, they do not form stable emulsion. However, emulsion of ink and fountain solution can form during shearing, compressing, and decompressing actions by the rollers and cylinders, especially the ink rollers and plate cylinder, on a wet lithographic press. For wet press with integrated inking system, ink and fountain solution are emulsified on the ink rollers before transferred to the plate.

For off-press development with ink and/or fountain solution, or with a hydrophobic paste (including liquid) and/or an aqueous solution, a developing device which carries ink and/or fountain solution, or a hydrophobic paste and/or an aqueous solution, can be used. Preferably, the plate is developed with (i) ink, (ii) both ink and fountain solution, (iii) a hydrophobic paste, or (iv) both a hydrophobic paste and an aqueous solution; and the device carries corresponding developing fluid or fluids (i, ii, iii, or iv). For plate developable with ink, a regular ink or single-fluid ink can be used. For plate requiring more than one developing fluid (including paste), the ink (or hydrophobic paste) and the fountain solution (or the aqueous solution) can be applied by any means and at any sequence or combination. The same developing fluid may be applied more than once (such as from different rollers), and different compositions of the same type of fluid (such as different aqueous solutions) can be used in the same developing device. Preferably, the fountain solution (or the aqueous solution) is applied first (for example, by spray, dipping, roller coating, or slot coating) to dampen the plate, followed by applying ink (for example, with one or more ink rollers) to remove the photosensitive layer in the non-hardened areas. After applying ink, the plate may be further applied with the fountain solution (or the aqueous solution) or a gum solution (plate finisher), to further clean the background areas and/or to protect the lithographic surface of the plate. For plate with a water soluble or dispersible overcoat, the overcoat can be removed by contacting with fountain solution or the aqueous solution during the off-press development. Alternatively, the overcoat can be removed by rinse with water or other aqueous solution in a separate step before the development.

The hydrophobic paste can be any liquid or paste with at least one water-insoluble organic solvent or oil as the main solvent, which can dissolve or disperse (and therefore develop) the photosensitive layer of this invention. Ink is one of such materials. The hydrophobic paste may or may not contain pigment or dye. The oil can be a petroleum oil, vegetable oil, animal oil, or synthetic oil. The aqueous solution can be any water-based solutions that can dampen the substrate surface of the plate, or can be water. Fountain solution is one of such aqueous solutions. The aqueous solution can be neutral, slight acidic, or slightly basic, preferably with a pH of 3.0 to 10.0, more preferably 4.0 to 9.0, and most preferably 5.0 to 8.0.

The methods as described in of U.S. patent application Ser. Nos. 11/057,663, 11/175,518, 11/336,132, 11/356,911, 11/453,522, 11/504,561, and 11/595,468, the entire disclosure of which is hereby incorporated by reference, can be used for the lithographic printing plates of this instant application.

The invention is further illustrated by the following non-limiting examples of its practice. Unless specified, all the values are by weight.

Examples 1-10

Ten sheets of electrochemically grained, anodized and polyvinylphosphonic acid treated aluminum substrates were coated with the photosensitive layer formulations PS-1 to PS-10 (as listed in Table 1), respectively, with a #6 Mayer rod, followed by hot air blow drying and baking in an oven at 90° C. for 2 min.

TABLE 1

(all values are by weight)

| Component | PS-1 | PS-2 | PS-3 | PS-4 | PS-5 | PS-6 | PS-7 | PS-8 | PS-9 | PS-10 |
|---|---|---|---|---|---|---|---|---|---|---|
| Carboset 527 (Alkaline soluble polymeric binder with acid No. of 80, from B. F. Goodrich) | 2.69 | 2.69 | 2.69 | 2.69 | 2.69 | 2.69 | 2.69 | 4.56 | 4.56 | 4.56 |
| Sartomer CN975 (Hexafunctional urethane acrylate monomer from Sartomer Company) | 6.43 | | | | 3.22 | 3.22 | 3.22 | 4.56 | | |
| Sartomer SR-399 (Pentafunctional non-urethane acrylate monomer from Sartomer Company) | | 6.43 | | | 3.22 | | | | 4.56 | |
| Sartomer SR-295 (Tetrafunctional non-urethane acrylate monomer from Sartomer Company) | | | 6.43 | | | 3.22 | | | | |
| Sartomer SR-349 (Difunctional non-urethane acrylate monomer from Sartomer Company) | | | | 6.43 | | | 3.22 | | | 4.56 |
| Renol Blue B2G-HW (60 parts blue pigment dispersed in 40 parts polyvinylbutyral from Ciba) | 0.57 | 0.57 | 0.57 | 0.57 | 0.57 | 0.57 | 0.57 | 0.57 | 0.57 | 0.57 |
| Pluronic L43 (Nonionic surfactant from BASF) | 0.14 | 0.14 | 0.14 | 0.14 | 0.14 | 0.14 | 0.14 | 0.14 | 0.14 | 0.14 |
| 2,2'-Bis(2-chlorophenyl)-4,4',5,5'-tetraphenyl-1,1'-biimidazole | 1.21 | 1.21 | 1.21 | 1.21 | 1.21 | 1.21 | 1.21 | 1.21 | 1.21 | 1.21 |
| 4,4'-Bis(diethylamino)benzophenone | 0.72 | 0.72 | 0.72 | 0.72 | 0.72 | 0.72 | 0.72 | 0.72 | 0.72 | 0.72 |
| 2-Mercaptobenzoxazole | 0.24 | 0.24 | 0.24 | 0.24 | 0.24 | 0.24 | 0.24 | 0.24 | 0.24 | 0.24 |
| 1-Methoxy-2-propanol | 61.60 | 61.60 | 61.60 | 61.60 | 61.60 | 61.60 | 61.60 | 61.60 | 61.60 | 61.60 |
| 2-Butanone | 26.40 | 26.40 | 26.40 | 26.40 | 26.40 | 26.40 | 26.40 | 26.40 | 26.40 | 26.40 |
| Monomer to polymeric binder weight ratio | 2.20 | 2.20 | 2.20 | 2.20 | 2.20 | 2.20 | 2.20 | 0.95 | 0.95 | 0.95 |
| Multifunctional monomer to polymeric binder weight ratio | 2.20 | 2.20 | 2.20 | 0.00 | 2.20 | 2.20 | 1.10 | 0.95 | 0.95 | 0.00 |
| Multifunctional monomer to alkaline soluble polymeric binder weight ratio | 2.39 | 2.39 | 2.39 | 0.00 | 2.39 | 2.39 | 1.19 | 1.00 | 1.00 | 0.00 |

Each of the photosensitive layer coated plates was further coated with a water-soluble overcoat OC-1 using a #6 Mayer rod, followed by hot air blow drying and baking in an oven at 90° C. for 2 min. The above coating and drying were performed under red light and the plates were kept in a light-tight box before development.

| OC-1 | |
|---|---|
| Component | Weight ratios |
| Airvol 203 (Polyvinyl alcohol from Air Products) | 15.0 |
| Triton X-100 (Surfactant from Union Carbide) | 0.20 |
| Water | 85.0 |

The above coated plates (Plates #1 to #10, with PS-1 to PS-10, respectively) were exposed with a violet laser imager equipped with a 60 mw laser diode emitting at about 405 nm (MAKO 8 from ECRM) at a dosage of 65 µJ/cm². The exposed plates were developed with an alkaline aqueous developer containing 2.0% by weight of potassium silicate and 3.0% by weight of a nonionic surfactant, and rinsed with water. The laser exposure was performed under an orange light (with a cut off wavelength of 550 nm-no light below 550 nm), and the development was performed under a red light. The developed plates were evaluated for the imaging pattern and background, with the results listed in Table 2.

TABLE 2

| | Plate | | | | | | | | | |
|---|---|---|---|---|---|---|---|---|---|---|
| | #1 | #2 | #3 | #4 | #5 | #6 | #7 | #8 | #9 | #10 |
| Photosensitive layer | PS-1 | PS-2 | PS-3 | PS-4 | PS-5 | PS-6 | PS-7 | PS-8 | PS-9 | PS-10 |
| Imaging pattern | Good | Good | Good | Wash off | Good | Good | Fair | Fair | Poor | Wash off |
| Background | Clean | Clean | Clean | Clean | Clean | Clean | Clean | Clean | Clean | Clean |
| Highlight resolution | 2% | 2% | 2% | Wash off | 2% | 2% | 20% | 20% | >20% | Wash off |

Example 11

A photosensitive layer fluid PS-11 was prepared by mixing all components in a 200 ml bottle, and continuing stirring until all materials are dissolved or dispersed. The photosensitive fluid was coated onto an electrochemically grained and anodized aluminum substrate with a #8 Mayer rod, followed by drying in an oven at 90° C. for 2 minutes.

| PS-11 | |
|---|---|
| Component | Weight (g) |
| Carboset 527 (Alkaline soluble polymeric binder with acid number of 80, from B. F. Goodrich) | 2.66 |
| Ebecryl 220 (Blend of a hexafunctional urethane acrylate monomer and a tetrafunctional non-urethane aliphatic acrylate monomer from UCB Chemicals) | 4.94 |
| Renol Blue B2G-HW (Blue pigment dispersed in polyvinylbutyral from Clariant) | 0.47 |
| Pluronic L43 (Nonionic surfactant from BASF) | 0.11 |
| 2,2'-Bis(2-chlorophenyl)-4,4',5,5'-tetraphenyl-1,1'-biimidazole | 1.01 |
| 2-Mercaptobenzoxazole | 0.40 |
| 4,4'-Bis(diethylamino)benzophenone | 0.40 |
| Acetone | 40.00 |
| 2-methoxypropanol | 50.00 |

The photosensitive layer coated plate was further coated with a water-soluble overcoat OC-1 using a #6 Mayer rod, followed by hot air blow drying and baking in an oven at 90° C. for 2 min.

The above coated plate was exposed with a violet laser imager equipped with a laser diode emitting at about 405 nm (MAKO-4 from ECRM) at dosages of about 65 and 90 µJ/cm². The exposed plate was preheated to 105° C. for 1 minute, washed with water to remove the overcoat, developed with an alkaline aqueous developer containing potassium silicate (1.5% by weight) and surfactants, rinsed with water, gummed up with Viking Negative Plate Cleaner And Finisher (from 3M), and then printed on an AB Dick 360 lithographic press for 1000 impressions (no further printing was performed). The printed sheets showed good inking, clean background, and a resolution of 2-98% at 90 µJ/cm². The plate was tested under a red or orange room light before being developed.

Example 12

A total of 100 g solid pigment dispersion Renol Blue B2G-HW (copper phthalocyanine dispersed in polyvinylbutyral from Clariant) was added into 900 g of 2-methoxypropanol in a 2000 ml stainless steel beaker with stirring at a medium speed (about 500 rpm) with a high speed disperser (Model EMD-100 from Fawcett Co.). The mixture was further dispersed at high speed (about 4000 rpm) for about 60 minutes to form a 10% Renol Blue B2G-HW liquid pigment dispersion.

All the materials in PS-11, except for the 0.47 g of Renol Blue B2G-HW and 4.23 g of 2-methoxypropanol, were mixed in a 200 ml bottle and were continuously stirred until all solid materials were dissolved to form a solution. Then 4.7 g of the 10% Renol Blue B2G-HW liquid pigment dispersion was slowly added into the solution with stirring to form the photosensitive coating fluid PS-12.

The photosensitive fluid PS-12 was coated onto an electrochemically grained and anodized aluminum substrate with a #8 Meyer rod, followed by drying in an oven at 90° C. for 2 minutes.

The photosensitive layer coated plate was further coated with a water-soluble overcoat OC-1 using a #6 Meyer rod, followed by hot air blow drying and baking in an oven at 90° C. for 2 min.

The above coated plate was tested with the same procedure as in EXAMPLE 11. The printed sheets gave good inking, clean background, and a resolution of 1-98% at 65 µJ/cm².

This plate showed faster photospeed than the plate of EXAMPLE 11. Since the only difference between these 2 plates are the pigments, which is added as solid dispersion in EXAMPLE 11 and as liquid dispersion in EXAMPLE 12, these results indicate that the utilization of a liquid pigment dispersion improves the photospeed of the plate.

Example 13

An electrochemically grained, anodized, and polyvinyl phosphonic acid treated aluminum sheet was coated with the photosensitive layer formulation PS-13 with a #6 Mayer rod, followed by drying in an oven at 90° C. for 2 min.

PS-13

| Component | Weight ratios |
|---|---|
| Neocryl B-728 (Acrylic polymeric binder from Zeneca) | 2.38 |
| Ebecryl 220 (Blend of a hexafunctional urethane acrylate monomer and a tetrafunctional non-urethane aliphatic acrylate monomer from UCB Chemicals) | 6.72 |
| Pluronic L43 (Nonionic surfactant from BASF) | 0.54 |
| 2,2'-Bis(2-chlorophenyl)-4,4',5,5'-tetraphenyl-1,1'-biimidazole | 1.52 |
| 4,4'-Bis(dimethylamino)benzophenone | 0.54 |
| 2-Mercaptobenzoxazole | 0.14 |
| N-phenyl glycine | 0.16 |
| 2-Butanone | 88.00 |

The photosensitive layer coated plate was further coated with a water-soluble overcoat OC-2 using a #6 Mayer rod, followed by drying in an oven at 100° C. for 2 min.

OC-2

| Component | Weight (g) |
|---|---|
| Airvol 203 (polyvinyl alcohol from Air Products) | 4.50 |
| Poly(N-vinylpyrrolidone) | 0.50 |
| Water | 95.00 |

The plate was exposed with a violet plate imager equipped with a 60 mw violet laser diode emitting at about 405 nm (MAKO-8 from ECRM) for a dosage of about 65 µJ/cm². The plate was imaged in an orange light room (with Fuji Yellow FV30 lights from Encapsulite), and was kept in a light tight box before and after imaging.

The laser exposed plate was treated with an aqueous solution comprising 5% citric acid and 0.1% Mergal 680 (preservative from Troy) by dipping in the solution for 10 seconds. This deactivation treatment was performed under red light.

The deactivated plate was tested on a wet lithographic press (AB Dick 360) under office white fluorescence light. The plate was directly mounted on the plate cylinder of the press. After starting the press, the fountain roller was engaged for 20 rotations, the ink roller (carrying emulsion of ink and fountain solution) was applied to the plate cylinder for 20 rotations, and the plate cylinder was then engaged with the blanket cylinder and printed with paper for 200 impressions. The plate rolled up to clean background and good inking under 10 impressions and had a resolution of 1-98%.

I claim:

1. A method of processing a lithographic printing plate comprising in order:
    (a) providing a lithographic printing plate comprising on a substrate a photosensitive layer comprising a polymeric binder, a urethane monomer having at least 3 (meth) acrylate groups, a non-urethane monomer having at least 3 (meth)acrylate groups, a hexaarylbiimidazole compound, and a sensitizing dye; wherein said photosensitive layer exhibits an affinity or aversion substantially opposite to the affinity or aversion of said substrate to at least one printing liquid selected from the group consisting of ink and an adhesive fluid for ink;
    (b) imagewise exposing said plate with a laser having a wavelength of from 250 to 430 nm at a dosage of less than 1000 µJ/cm² cause hardening of the photosensitive layer in the exposed areas; and
    (c) developing said exposed plate to remove the non-hardened areas of said photosensitive layer.

2. The method of claim 1 wherein said plate is developed with a non-alkaline aqueous developer having a pH of from 2.0 to 8.5 to remove the non-hardened areas of the photosensitive layer.

3. The method of claim 1 wherein said polymeric binder is alkaline soluble and said plate is developed with an aqueous alkaline developer having a pH of from 10.0 to 13.5 to remove the non-hardened areas of the photosensitive layer.

4. The method of claim 1 wherein said plate is developed with ink and/or fountain solution on a lithographic press.

5. The method of claim 1 wherein said plate is developed with ink, both ink and fountain solution, a hydrophobic paste, or both a hydrophobic paste and an aqueous solution, off a lithographic press.

6. The method of claim 1 wherein said plate further includes a water soluble or dispersible overcoat on the photosensitive layer.

7. The method of claim 1 wherein the weight ratio of all the monomers having at least 3 (meth)acrylate groups to all the polymeric binders is from 1.0 to 6.0.

8. The method of claim 1 wherein the weight ratio of all the monomers having at least 3 (meth)acrylate groups to all the polymeric binders is from 1.5 to 5.0.

9. The method of claim 1 wherein said urethane monomer has at least 6 (meth)acrylate groups.

10. The method of claim 1 wherein said non-urethane monomer has at least 4 (meth)acrylate groups.

11. The method of claim 1 wherein said non-urethane monomer has at least 4 (meth)acrylate groups and said urethane monomer has at least 4 (meth)acrylate groups.

12. The method of claim 1 wherein said non-urethane monomer has at least 4 (meth)acrylate groups and said urethane monomer has at least 6 (meth)acrylate groups.

13. The method of claim 1 wherein the weight ratio of all the urethane monomers having at least 3 (meth)acrylate groups to all the non-urethane monomers having at least 3 (meth)acrylate groups is from 0.10 to 10.0.

14. The method of claim 1 wherein the weight ratio of all the urethane monomers having at least 3 (meth)acrylate groups to all the non-urethane monomers having at least 3 (meth)acrylate groups is from 0.30 to 3.0.

15. The method of claim 1 wherein said photosensitive layer further includes a compound having a mercapto group.

16. The method of claim 1 wherein said photosensitive layer further includes an N-aryl-α-amino acid, its salt or ester.

17. The method of claim 1 wherein said photosensitive layer further includes a compound having a mercapto group, and a compound selected from the group consisting of N-aryl-α-amino acids, their salts and esters.

18. The method of claim 1 wherein said sensitizing dye is a compound having at least one dialkylaminobenzene moiety.

19. The method of claim 1 wherein said urethane monomer is an aromatic urethane (meth)acrylate monomer having at least 3 (meth)acrylate groups.

20. The method of claim 1 wherein said urethane monomer is an aliphatic urethane (meth)acrylate monomer having at least 3 (meth)acrylate groups.

21. The method of claim 1 wherein said polymeric binder comprises (meth)acrylate units in the main chain.

22. The method of claim 1 wherein said photosensitive layer further comprises a pigment at 0.5 to 15% by weight of said photosensitive layer and is coated from a coating fluid, and said coating fluid is prepared by mixing a liquid pigment dispersion with the remaining materials for said coating fluid; wherein said pigment dispersion comprises the pigment dispersed in at least one organic solvent and is prepared through a high speed disperser, a ball mill or a roll mill, and has a pigment content of at least 2% and a solvent content of at least 40% by weight of the pigment dispersion during the dispersing or milling process; and at least a portion of said remaining materials forms a solution before mixing with said liquid pigment dispersion.

23. A method of processing a lithographic printing plate comprising in order:

(a) providing a lithographic printing plate comprising (i) a hydrophilic substrate, (ii) an oleophilic photosensitive layer comprising an alkaline soluble polymeric binder, a urethane monomer having at least 3 (meth)acrylate groups, a non-urethane monomer having at least 3 (meth)acrylate groups, a hexaarylbiimidazole compound, and a sensitizing dye, and (iii) a water soluble or dispersible overcoat;

(b) imagewise exposing said plate with a laser having a wavelength of from 250 to 430 nm at a dosage of less than 300 $\mu J/cm^2$ to cause hardening of the photosensitive layer in the exposed areas;

(c) preheating said exposed plate to 60 to 150° C. for 1 to 300 seconds;

(d) rinsing said preheated plate with water to remove said overcoat without developing said photosensitive layer; and (e) developing said exposed plate with an alkaline aqueous developer having a pH of from 10 to 13.5 to remove the non-hardened areas of said photosensitive layer.

24. A method of lithographically printing images on a receiving medium comprising in order:

(a) providing a lithographic printing plate comprising on a hydrophilic substrate an oleophilic photosensitive layer comprising a polymeric binder, a urethane monomer having at least 3 (meth)acrylate groups, a non-urethane monomer having at least 3 (meth)acrylate groups, a hexaarylbiimidazole compound, and a sensitizing dye;

(b) imagewise exposing said plate with a laser having a wavelength of from 250 to 430 nm at a dosage of less than 1000 $\mu J/cm^2$ to cause hardening of the photosensitive layer in the exposed areas;

(c) developing said exposed plate with ink and/or fountain solution on a lithographic press to remove the non-hardened areas of the photosensitive layer; and (d) lithographically printing images from said plate to the receiving medium.

25. The method of claim 1 wherein said urethane monomer has at least 4 (meth)acrylate groups.

26. The method of claim 1 wherein the weight ratio of all the monomers having at least 3 (meth)acrylate groups to all the polymeric binders is at least 0.5.

27. The method of claim 1 wherein said plate is heated to 50 to 200° C. for 1 to 600 seconds after said laser exposure and before said development.

* * * * *